United States Patent
Lee et al.

(10) Patent No.: US 7,507,997 B2
(45) Date of Patent: Mar. 24, 2009

(54) ORGANIC LIGHT-EMITTING DISPLAY

(75) Inventors: Hsin-hung Lee, Hsinchu (TW); Yi-cheng Chang, Taipei (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/412,427

(22) Filed: Apr. 27, 2006

(65) Prior Publication Data

US 2007/0176184 A1   Aug. 2, 2007

(30) Foreign Application Priority Data

Jan. 27, 2006   (TW) .............................. 95103412 A

(51) Int. Cl.
| | |
|---|---|
| H01L 29/04 | (2006.01) |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |
| H01L 29/18 | (2006.01) |
| H01L 33/00 | (2006.01) |
| H01L 31/062 | (2006.01) |
| H01L 31/113 | (2006.01) |

(52) U.S. Cl. ............................ 257/72; 257/59; 257/88; 257/291; 257/E25.008; 257/E51.005

(58) Field of Classification Search .................. 257/59, 257/72, 88, 291, E25.008, E51.005
See application file for complete search history.

(56) References Cited

U.S. PATENT DOCUMENTS

| | | | | |
|---|---|---|---|---|
| 6,631,555 | B1 * | 10/2003 | Youker et al. ................... 29/830 |
| 6,724,150 | B2 * | 4/2004 | Maruyama et al. ....... 315/169.3 |
| 6,863,219 | B1 | 3/2005 | Jacobsen et al. |
| 6,911,675 | B2 * | 6/2005 | Kato et al. ..................... 257/86 |
| 6,992,439 | B2 * | 1/2006 | Yamazaki et al. ........... 313/512 |
| 7,045,861 | B2 * | 5/2006 | Takayama et al. ........... 257/347 |
| 2004/0135520 | A1 | 7/2004 | Park et al. |
| 2004/0189213 | A1 * | 9/2004 | Okazaki et al. .......... 315/169.1 |
| 2005/0122036 | A1 * | 6/2005 | Park et al. ................... 313/504 |
| 2005/0140281 | A1 * | 6/2005 | Park ........................... 313/505 |
| 2005/0140303 | A1 * | 6/2005 | Lee et al. ................. 315/169.3 |
| 2005/0140305 | A1 * | 6/2005 | Kim ........................ 315/169.3 |
| 2005/0161740 | A1 * | 7/2005 | Park et al. ................... 257/347 |
| 2005/0162070 | A1 * | 7/2005 | Park ........................... 313/503 |
| 2005/0212413 | A1 * | 9/2005 | Matsuura et al. ............ 313/504 |
| 2005/0227397 | A1 * | 10/2005 | Kato et al. .................... 438/30 |

(Continued)

FOREIGN PATENT DOCUMENTS

TW   1230564   4/2005

(Continued)

*Primary Examiner*—Ida M Soward

(57) ABSTRACT

An organic light-emitting display (OLED) includes a first substrate, a first organic light-emitting pixel area, a first driver, a second substrate, a system circuitry, and a conductive member. The second substrate is opposite to the first substrate. The first organic light-emitting pixel area is defined on the first substrate and is sealed between the first substrate and the second substrate. The first driver disposed on the first substrate is used for driving the first organic light-emitting pixel area to generate images. The system circuitry disposed on the second substrate is for electrically connected to the first driver. The first substrate and the second substrate are electrically connected with each other through the conductive member.

20 Claims, 8 Drawing Sheets

U.S. PATENT DOCUMENTS

| | | | |
|---|---|---|---|
| 2006/0132690 A1* | 6/2006 | Choi | 349/129 |
| 2006/0186399 A1* | 8/2006 | Yamazaki et al. | 257/40 |
| 2006/0220008 A1* | 10/2006 | Ko | 257/40 |
| 2006/0276096 A1* | 12/2006 | Wang et al. | 445/2 |
| 2007/0018969 A1* | 1/2007 | Chen et al. | 345/173 |
| 2007/0210364 A1* | 9/2007 | Kato et al. | 257/296 |
| 2008/0062095 A1 | 3/2008 | Park et al. | |
| 2008/0170007 A1* | 7/2008 | Tanada | 345/76 |

FOREIGN PATENT DOCUMENTS

| | | |
|---|---|---|
| TW | 1240418 | 9/2005 |

* cited by examiner

ORGANIC LIGHT-EMITTING DISPLAY

CROSS-REFERENCE TO RELATED ART

Not Applicable

STATEMENT REGARDING FEDERALLY SPONSORED RESEARCH OR DEVELOPMENT

Not Applicable

THE NAMES OF THE PARTUES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to an organic light-emitting display, and more particularly, to an organic light-emitting display integrating logic circuitry and an organic light-emitting pixel area on a substrate.

2. Description of the Related Art

With a rapid development of monitor types, novelty and colorful monitors with high resolution, e.g., liquid crystal displays (LCDs), are indispensable components used in various electronic products such as monitors for notebook computers, personal digital assistants (PDA), digital cameras, and projectors. The demand for the novelty and colorful monitors has increased tremendously.

Liquid crystal display (LCD) monitors control pixel luminance by adjusting voltage drop applied on a liquid crystal layer of the liquid crystal display. Differing from liquid crystal displays (LCDs), Organic Light Emitting Displays (OLEDs) determine the pixel luminance by adjusting forward bias current flowing through an LED. With self-lighting technique without requiring an additional light source, the OLED provides a faster response time period than the LCD. In addition, the OLED has advantages of better contrast and a wider visual angle. Moreover, the OLED is capable of being manufactured by existing TFT-LCD process. The commonly used OLED utilizes a Low Temperature Polysilicon Thin Film Transistor (LTPS TFT) substrate or a-Si substrate.

With reference to FIG. 1 showing a structure of a conventional Organic Light-Emitting Display (OLED) 10, the Organic Light-Emitting Display 10 comprises a substrate 11 on which an active area 12, a gate driver 14, and a source driver 16 are disposed. Other key logic circuitry such as a central processing unit (CPU), a graphics controller, a DC/DC converter and a timing circuit are configured on a printed circuit board (PCB) 18. A flexible PCB 15 is disposed among the gate driver 14, the source driver 16, and logic circuitry, functioning as a bridge for intercommunication. However, such design occupies space and increases product volume. Although manufacturers tend to integrate systems on panel (SOP), due to a limitation on LTPS process, some circuits such as a central processing unit occupies quite a large area so that the panel can only occupy a smaller area as well. Therefore, that is a disadvantage of shrinking a volume of the end product.

BRIEF SUMMARY OF THE INVENTION

An objective of the present invention is to provide an organic light-emitting display having an organic light-emitting pixel area defined on a first substrate, and a system circuitry disposed on a second substrate opposite from the first substrate, to solve the problem existing in prior art.

Briefly summarized, the invention provides an organic light-emitting display (OLED). The organic light-emitting display comprises a first substrate, a first organic light-emitting pixel area, a first driver, a second substrate, a system circuitry, and a conductive member. The second substrate is opposite from the first substrate. The first organic light-emitting pixel area is defined on the first substrate and is sealed between the first and second substrates with glue. The first driver disposed on the first substrate is used for driving the first organic light-emitting pixel area. The system circuitry disposed on the second substrate is for electrically connected to the first driver. The first substrate and the second substrate are electrically connected with each other by using the conductive member.

A second organic light-emitting pixel area is also defined on the second substrate, so that the organic light-emitting display can display images in two opposite directions.

The organic light-emitting pixel area for displaying an image and the circuit for driving the organic light-emitting pixel area, are defined on the first substrate; the system circuitry is disposed on the second substrate which is opposite from the first substrate. Through a conductive layer raised by a pad, the first substrate is capable of electrically connecting to the second substrate. Compared to the prior art fabricating the system circuitry which comprises a CPU, a graphic controller, a voltage regulator, a timing circuit on a printed circuit board, the present invention disposes the system circuitry on the second substrate which is in non-use and is opposite from the first substrate. In this manner, the present invention does not arrange the printed circuit board, thereby reducing space occupancy and wastage. These and other objectives of the present invention will become apparent to those of ordinary skill in the art after reading the following detailed description of the preferred embodiment that is illustrated in the various figures and drawings.

DETAILED DESCRIPTION OF THE PREFERRED EMBODIMENT

Figure 1:
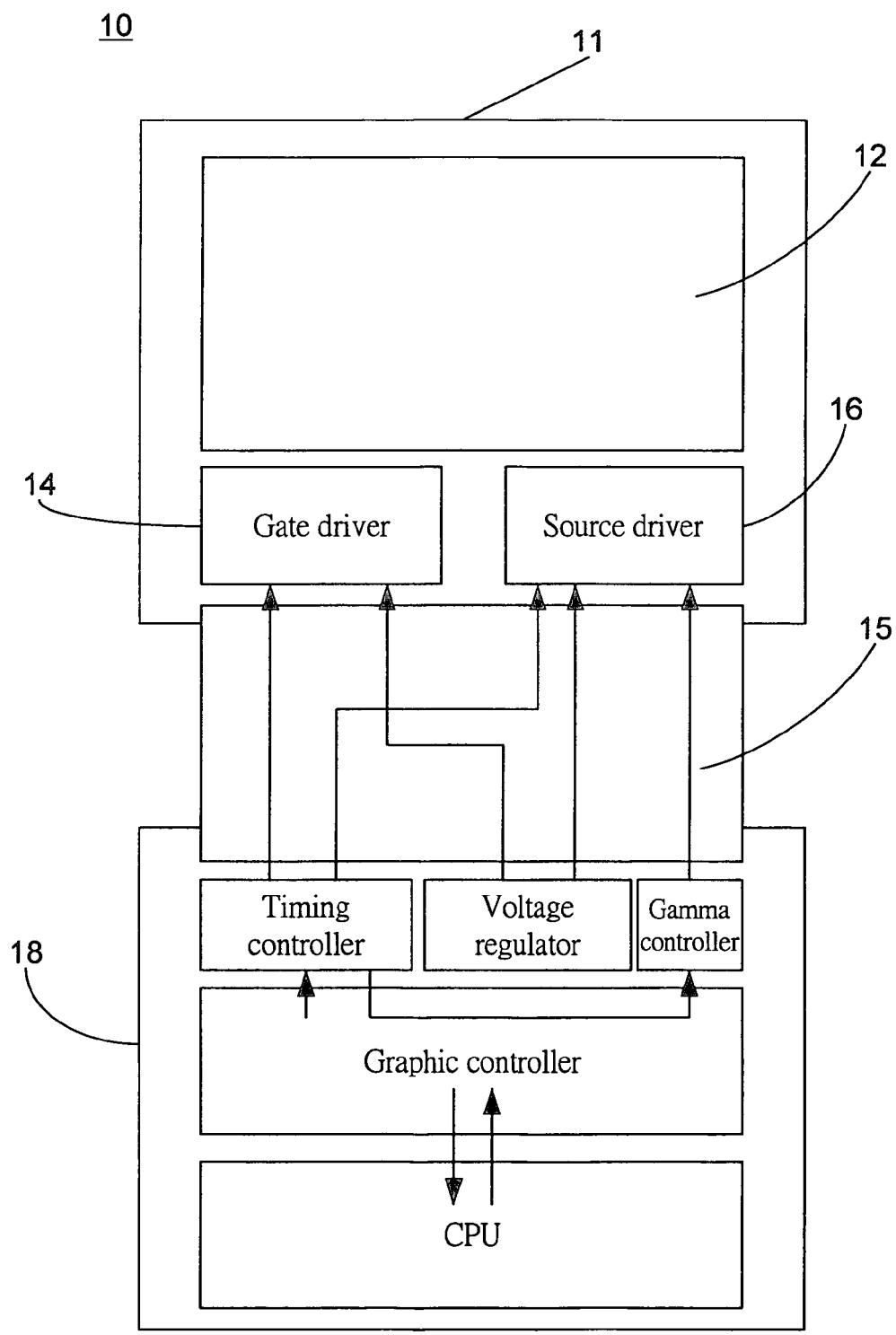
FIG. 1 shows a structure of a conventional organic light-emitting display.
Figure 2:
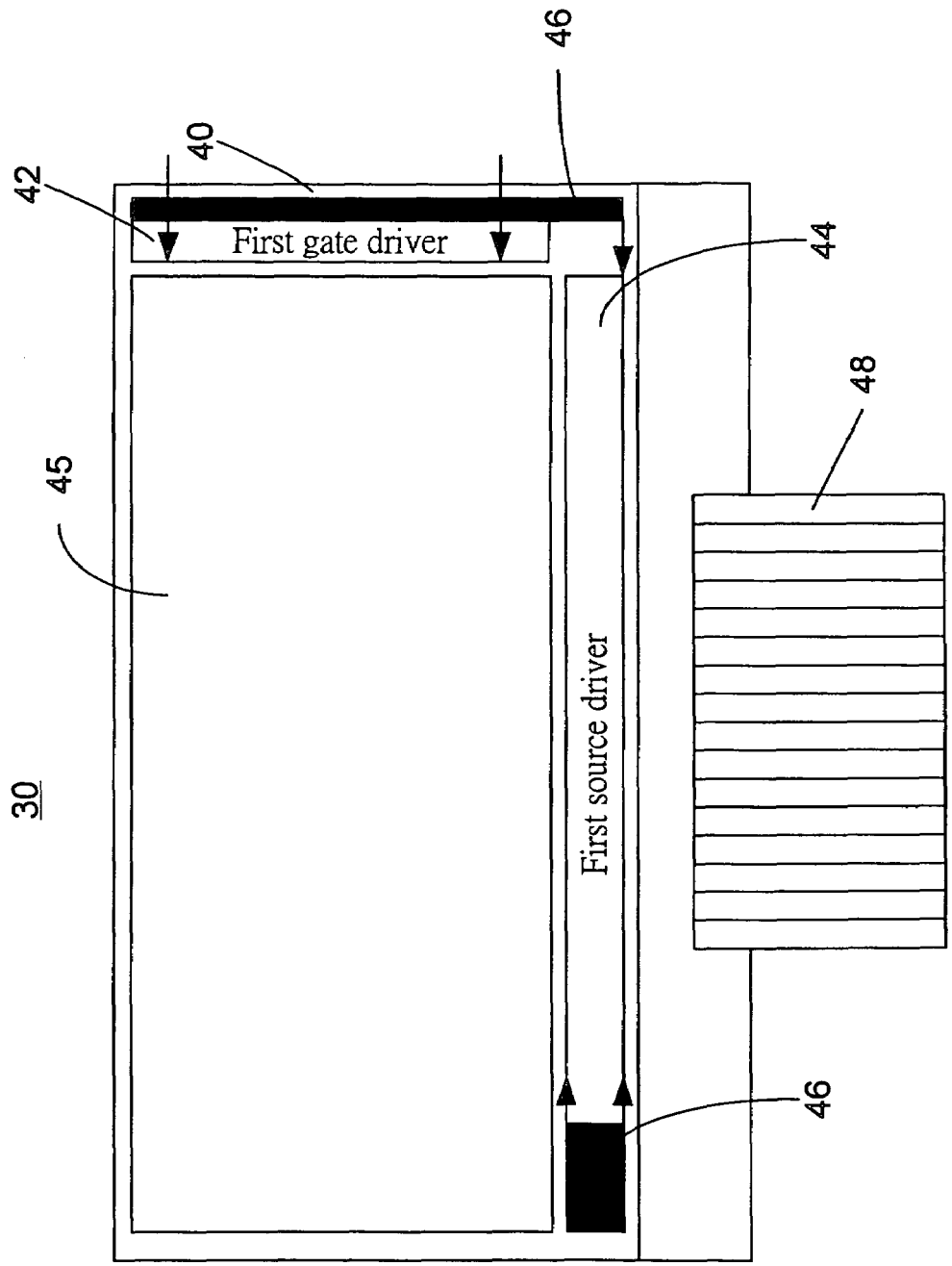
FIG. 2 is a bottom view of a first embodiment of the organic light-emitting display according to the present invention.
Figure 3:
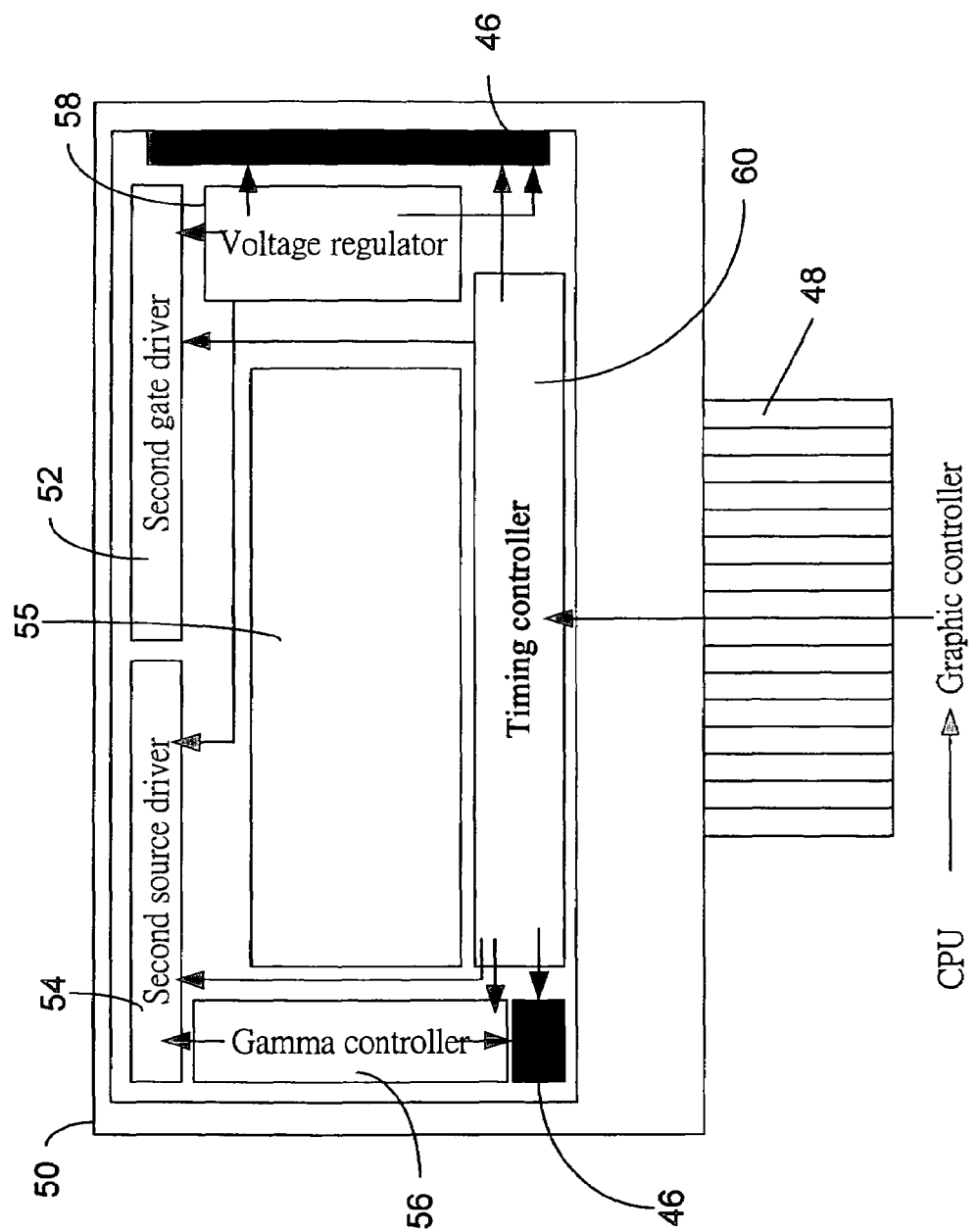
FIG. 3 is a top view of the first embodiment of the organic light-emitting display according to the present invention.
Figure 4:
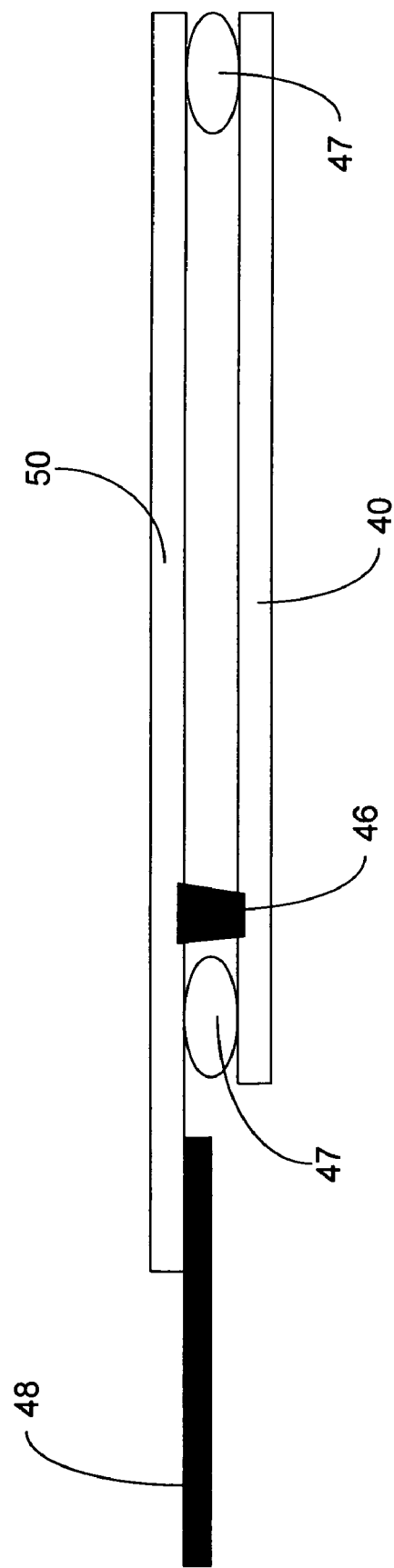
FIG. 4 is a side view of the first embodiment of the organic light-emitting display according to the present invention.

Referring to FIGS. 2, 3, and 4, FIG. 2 is a bottom view of first embodiment, FIG. 3 is a top view of first embodiment, and FIG. 4 is a side view of first embodiment, of the organic light-emitting display (OLED) 30 according to the present invention. The organic light-emitting display 30 comprises a first substrate 40 and a second substrate 50. Both the first substrate 40 and the second substrate 50 are made of glass. A first gate driver 42, a first source driver 44, and a first organic light-emitting pixel area 45 are defined on the first substrate 40. As the person skilled in the art is aware, the first gate driver 42 is used for generating a first scan signal, the first source driver 44 is used for outputting a first pixel signal upon receiving the first scan signal, while the first organic light-emitting pixel area 45 is used for displaying images based on the first pixel signal from the first source driver 44.

The organic light-emitting display 30 also comprises a second substrate 50 on which a second gate driver 52, a second source driver 54, a second organic light-emitting pixel area 55, and a system circuitry (having a gamma controller 56, a voltage regulator 58, and a timing circuit 60 as shown in FIG. 3). As the person skilled in the art is aware, the second driver 52 is used for generating a second scan signal, a second source driver 54 is used for outputting a second pixel signal upon receiving the second scan signal. The second organic light-emitting pixel area 55 is used for displaying an image based on the second pixel signal. The gamma controller 56 is used for compensating gamma value for each pixel signal. The timing controller 60 is used for providing clock signals to other circuits. The voltage regulator 58 provides voltage to other circuits. It is noted that an area of the first organic light-emitting pixel area 45 is larger than the area of the second organic light-emitting pixel area 55.

In addition, a flexible printed circuit board 48 is connected to the second substrate 50. A control circuitry which comprises a central processing unit and a graphic controller is electrically connected to the flexible printed circuit board 48 or is connected on the flexible printed circuit board 48. In other words, the control circuitry is used for controlling the operation of the organic light-emitting display 30.

The first substrate 40 is electrically connected with the second substrate 50 by means of conductive member 46. Furthermore, the use of seal glue 47, e.g., epoxy resin or glass with low melting point, between the first substrate 80 and the second substrate 90 can strengthen adhesion and is conducive to separate vapor.

Figure 5A:
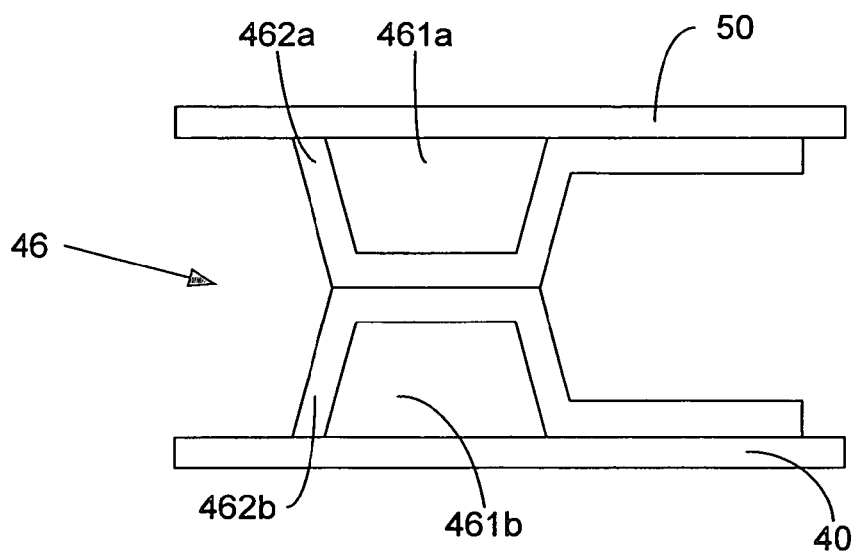
FIGS. 5A, 5B, and 5C depict various connections of the first substrate and the second substrate by means of the conductive member according to the present invention.
Figure 5B:
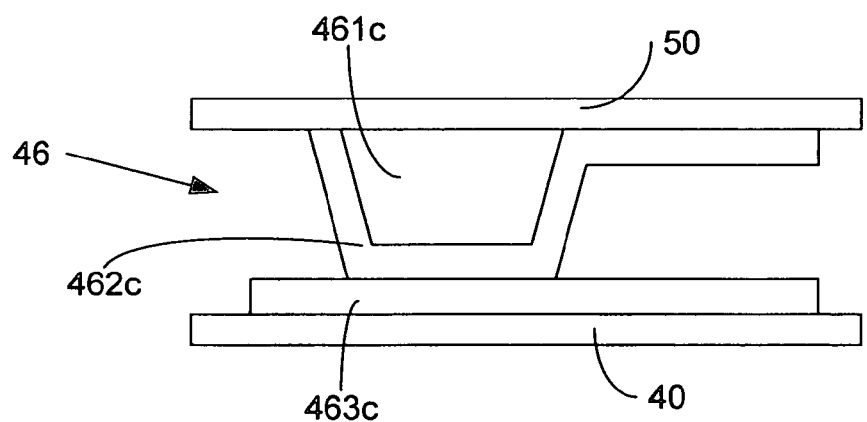
Figure 5C:
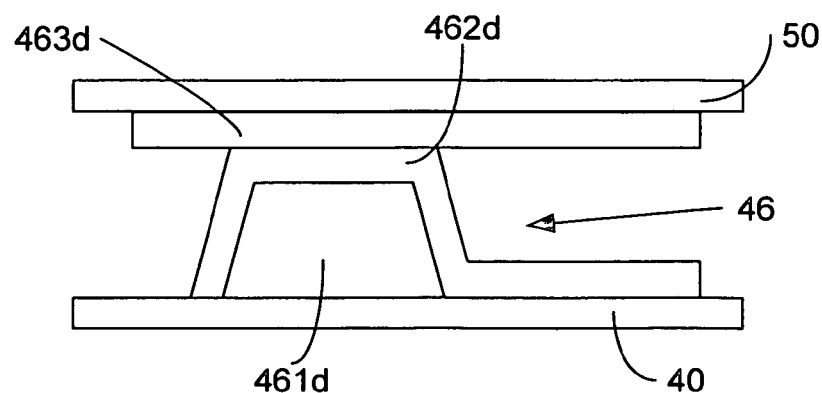

FIGS. 5A, 5B, and 5C depict various connections of the first substrate 40 and the second substrate 50 by means of conductive member 46. From FIG. 5A, a pad 461a is on the second substrate 50 and a conductive layer 462a covers the pad 461a, while a pad 461b is on the first substrate 40 and a conductive layer 462b covers the pad 461b. For the conductive layer 462b contacts with the conductive layer 462a, the first substrate 40 and the second substrate 50 electrically interconnects with each other. In FIG. 5B, a pad 461c is on the second substrate 50, and a conductive layer 462c covers the pad 461c and contacts with the conductive layer 463c on the first substrate 40, so that the first substrate 40 and the second substrate 50 electrically interconnects with each other. In FIG. 5C, a pad 461d is on the first substrate 40, and a conductive layer 462d covers the pad 461d and contacts with the conductive layer 463d on the second substrate 50, so that the first substrate 40 and the second substrate 50 electrically interconnects with each other.

Figure 6:
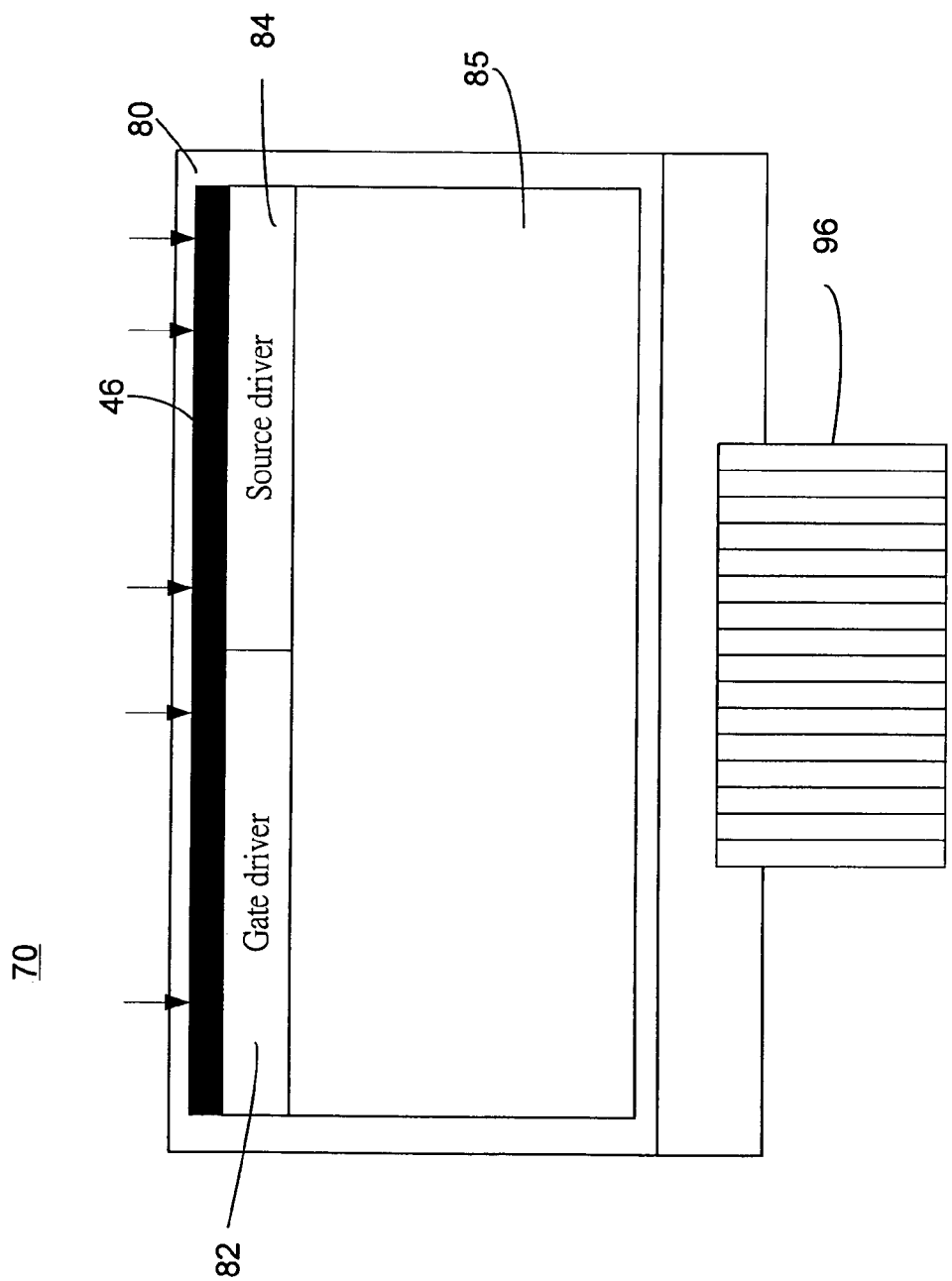
FIG. 6 is a bottom view of a second embodiment of the organic light-emitting display according to the present invention.
Figure 7:
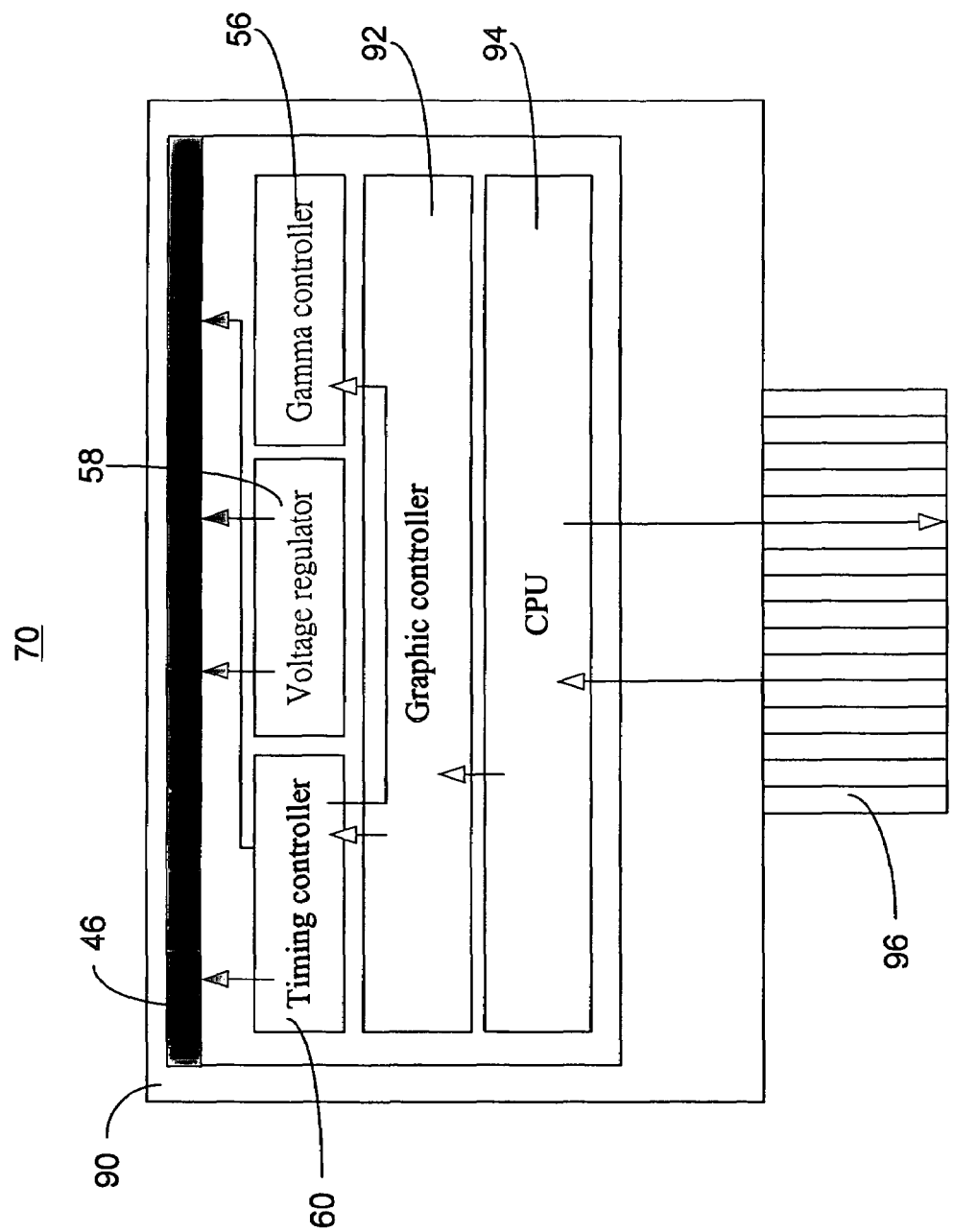
FIG. 7 is a top view of the second embodiment of the organic light-emitting display according to the present invention.
Figure 8:
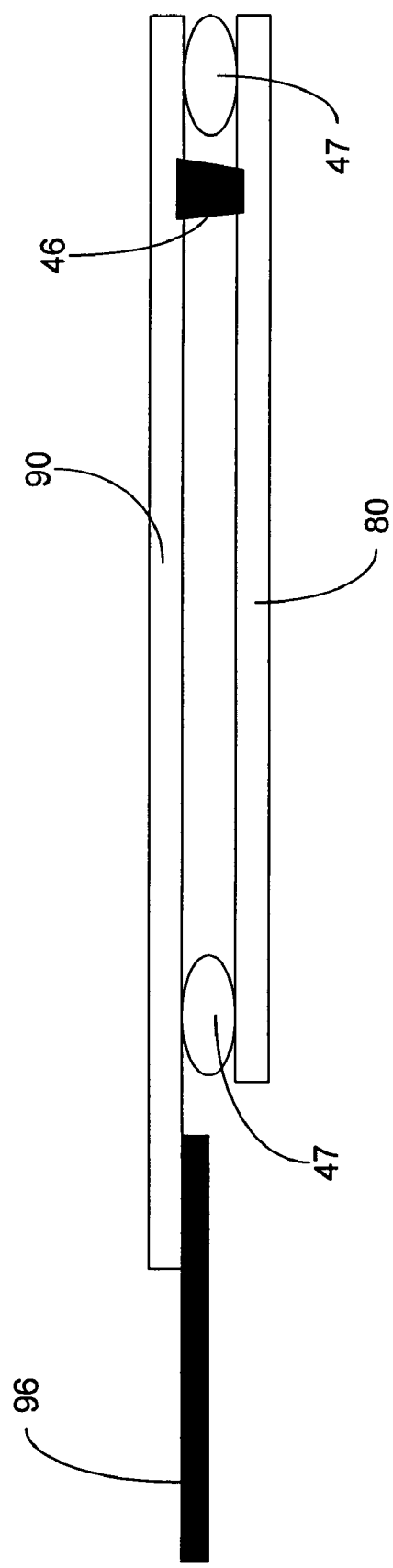
FIG. 8 is a side view of the second embodiment of the organic light-emitting display according to the present invention.

FIG. 6 is a bottom view of second embodiment, FIG. 7 is a top view of second embodiment, and FIG. 8 is a side view of second embodiment, of the organic light-emitting display (OLED) 70 according to the present invention. The organic light-emitting display 70 comprises a first substrate 80 and a second substrate 90. Both the first substrate 80 and the second substrate 90 are made of glass. A gate driver 82, a source driver 84 and an organic light-emitting pixel area 85 are defined on the first substrate 80. The gate driver 82 is used for generating a scan signal; the source driver 84 is used for outputting a pixel signal upon receiving the scan signal, while the organic light-emitting pixel area 85 is used for displaying images based on the pixel signal from the source driver 84.

The organic light-emitting display 70 also comprises a system circuitry having a gamma controller 56, a voltage regulator 58, a timing circuit 60, a CPU 94, and a graphic controller 92 disposed on the second substrate 90. The gamma controller 56 is used for compensating gamma value for each pixel signal. The voltage regulator 58 provides supply voltage to other circuits. The timing controller 60 is used for providing clock signals to other circuits. The CPU 94 and the graphic controller 92 are used for controlling the operation of the organic light-emitting display 70. The CPU 94 and the graphic controller 92 are also electrically connected to a flexible printed circuit board (PCB) 96 to establish electrical connection with circuits of other devices.

The organic light-emitting display 30 also comprises a second substrate 50 on which a second gate driver 52, a second source driver 54, a second organic light-emitting pixel area 55 and system circuitry (having a gamma controller 56, a voltage regulator 58, and a timing circuit 60 shown in FIG. 3). As the person skilled in the art is aware, the second driver 52 is used for generating a second scan signal, and a second source driver 54 is used for outputting a second pixel signal upon receiving the second scan signal. The second organic light-emitting pixel area 55 is used for displaying an image based on the second pixel signal. The gamma controller 56 is used for compensating gamma value for each pixel signal. The timing controller 60 is used for providing clock signals to other circuits. The voltage regulator 58 provides voltage to other circuits. It is noted that an area of the first organic light-emitting pixel area 45 is larger than the area of the second organic light-emitting pixel area 55.

The first substrate 80 is electrically connected with the second substrate 90 by means of the conductive member 46, as shown in FIGS. 5A through 5C. Furthermore, the use of seal glue 47, e.g., epoxy resin or glass with low melting point, between the first substrate 80 and the second substrate 90 can strengthen adhesion and is conducive to separate vapor.

It is appreciated that the first organic light-emitting pixel area is an active organic light-emitting pixel area or a passive organic light-emitting pixel area.

It is appreciated that all the circuits and the organic light-emitting pixel area defined on the second substrate are achieved through low temperature poly-silicon (LTPS) processes.

In contrast to prior art, the organic light-emitting display of the present invention arranges a first organic light-emitting pixel area on a first substrate, while a second organic light-emitting pixel area and system circuitry such as a central processing unit and a graphic controller are configured on a second substrate opposite to the first substrate. Moreover, configuring the system circuitry and the second organic light-emitting pixel area may be simultaneously done in the same LTPS processes without additional processes. In addition, either the first substrate or the second substrate utilizes a pad and a conductive layer covering the pad to achieve an electrical connection with each other. As a result, instead of using a flexible printed circuit board to interconnect the electrical elements on the first substrate and the second substrate as in prior art, the configuration of the present invention can provide a more flexible arrangement of circuits and also reduce costs for manufacturers.

The present invention has been described with references to certain preferred and alternative embodiments which are intended to be exemplary only. Accordingly, the scope of the invention shall be determined only by the appended claims.

What is claimed is:

1. An organic light-emitting display (OLED) comprising
a first substrate;
a first organic light-emitting pixel area defined on the first substrate;
a first driver disposed on the first substrate, for driving the first organic light-emitting pixel area;
a second substrate opposite to the first substrate, wherein the first organic light-emitting pixel area is sealed between the first substrate and the second substrate;
a system circuitry disposed on the second substrate and electrically connected to the first driver; and
a conductive member disposed between the first substrate and the second substrate, for electrically connecting the first substrate and the second substrate.

2. The organic light-emitting display of claim 1, wherein the first driver comprises a first gate driver for transmitting a first scan signal.

3. The organic light-emitting display of claim 1, wherein the first driver comprises a first source driver for outputting a first pixel signal.

4. The organic light-emitting display of claim 1, wherein the system circuitry comprises at least one of a timing controller, a voltage regulator, a gamma circuit, a graphics controller, and a central processing unit (CPU).

5. The organic light-emitting display of claim 1, further comprising a flexible printed circuit board connected to the second substrate.

6. The organic light-emitting display of claim 1, wherein the conductive member comprises:
a pad disposed on the first substrate; and
a conductive layer covering the pad, for electrically connecting the first substrate with the second substrate.

7. The organic light-emitting display of claim 1, wherein the conductive member comprises:
a pad disposed on the second substrate; and
a conductive layer covering the pad, for electrically connecting the second substrate with the first substrate.

8. The organic light-emitting display of claim 1, wherein the conductive member comprises:
a first pad disposed on the first substrate;
a first conductive layer covering the first pad;
a second pad disposed on the second substrate; and
a second conductive layer covering the second pad, so that the first conductive layer electrically connects with the second conductive layer.

9. The organic light-emitting display of claim 1, wherein the first substrate is made of glass.

10. The organic light-emitting display of claim 1, wherein the second substrate is made of glass.

11. The organic light-emitting display of claim 1, wherein the first organic light-emitting pixel area is an active organic light-emitting pixel area.

12. The organic light-emitting display of claim 1, wherein the first organic light-emitting pixel area is a passive organic light-emitting pixel area.

13. The organic light-emitting display of claim 1, further comprising:
a second organic light-emitting pixel area defined on the second substrate; and
a second driver disposed on the second substrate and electrically connected to the system circuitry, for driving the second organic light-emitting pixel area.

14. The organic light-emitting display of claim 13, wherein the second driver comprises a second gate driver for transmitting a second scan signal.

15. The organic light-emitting display of claim 13, wherein the second driver comprises a second source driver for outputting a second pixel signal.

16. The organic light-emitting display of claim 13, wherein an area of the first organic light-emitting pixel area is larger than the area of the second organic light-emitting pixel area.

17. The organic light-emitting display of claim 13, wherein the system circuitry comprises at least one of a timing controller, a voltage regulator, and a gamma circuit.

18. The organic light-emitting display of claim 17, further comprising a flexible printed circuit board electrically connected to the second substrate and a control circuitry for controlling the system circuitry.

19. The organic light-emitting display of claim 18, wherein the control circuitry comprises at least one of a graphics controller, and a central processing unit (CPU).

20. An organic light-emitting display (OLED) comprising:
a first substrate;
a first organic light-emitting pixel area defined on the first substrate;
a first driver disposed on the first substrate, for driving the first organic light-emitting pixel area;
a second substrate opposite to the first substrate;
a system circuitry, disposed on the second substrate, including a gamma controller compensating gamma value for at least one pixel signal, a voltage regulator for providing voltage, and a timing controller for providing clock signals; and
a conductive member disposed between the first substrate and the second substrate, for electrically connecting the first substrate and the second substrate.

* * * * *